(12) United States Patent
Goki

(10) Patent No.: US 12,020,892 B2
(45) Date of Patent: Jun. 25, 2024

(54) ETCHING APPARATUS AND ETCHING METHOD

(71) Applicant: KIOXIA CORPORATION, Tokyo (JP)

(72) Inventor: Yusuke Goki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 936 days.

(21) Appl. No.: 16/805,030

(22) Filed: Feb. 28, 2020

(65) Prior Publication Data

US 2021/0082656 A1 Mar. 18, 2021

(30) Foreign Application Priority Data

Sep. 17, 2019 (JP) .............................. JP2019-168743

(51) Int. Cl.
*H01J 37/08* (2006.01)
*H01J 37/305* (2006.01)
*H01L 21/3065* (2006.01)

(52) U.S. Cl.
CPC .......... *H01J 37/08* (2013.01); *H01J 37/3053* (2013.01); *H01L 21/3065* (2013.01); *H01J 2237/3151* (2013.01)

(58) Field of Classification Search
CPC .. H01J 37/08; H01J 37/3053; H01J 37/32357; H01J 2237/3151; H01J 2237/0245; H01J 2237/0822; H01L 21/3065; H01L 21/32131
USPC ........................................ 204/192.34, 298.36
See application file for complete search history.

(56) References Cited

U.S. PATENT DOCUMENTS

| 5,186,718 A | * | 2/1993 | Tepman | ............ H01L 21/67167 |
| | | | | 204/192.12 |
| 5,529,671 A | * | 6/1996 | Debley | ................. C23C 14/505 |
| | | | | 204/298.36 |
| 7,626,165 B2 | | 12/2009 | Iwasaki | |
| 8,536,539 B2 | | 9/2013 | Hirayanagi et al. | |
| 9,706,634 B2 | | 7/2017 | Liang | |
| 2013/0316536 A1 | | 11/2013 | Seto | |

(Continued)

FOREIGN PATENT DOCUMENTS

| JP | S63107118 A | 5/1988 |
| JP | H06116709 A | 4/1994 |

(Continued)

OTHER PUBLICATIONS

Translation of JP 2019-119045 (Year: 2019).*

(Continued)

*Primary Examiner* — Rodney G McDonald
(74) *Attorney, Agent, or Firm* — Kim & Stewart LLP

(57) ABSTRACT

An etching apparatus includes a substrate holder configured to hold a substrate, a first ion source that generates first ions and irradiates the substrate with the first ions such that the first ions are incident on the substrate in the substrate holder at a first incident angle, and a second ion source that generates second ions and irradiates the substrate with the second ions such that the second ions are incident on the substrate at a second incident angle different from the first incident angle. A controller is provided that controls at least one of the first incident angle and the second incident angle by moving at least one of the first ion source and the second ion source.

3 Claims, 4 Drawing Sheets

(56) References Cited

U.S. PATENT DOCUMENTS

| | | | |
|---|---|---|---|
| 2014/0308813 A1* | 10/2014 | Hsu | H01J 37/3053 |
| | | | 438/692 |
| 2017/0179381 A1* | 6/2017 | Park | H01L 43/12 |
| 2018/0069176 A1 | 3/2018 | Lee et al. | |
| 2020/0194226 A1 | 6/2020 | Kurunczi | |

FOREIGN PATENT DOCUMENTS

| | | | |
|---|---|---|---|
| JP | H08325728 A | | 12/1996 |
| JP | S63072120 A | | 4/1998 |
| JP | 2007220344 A | | 8/2007 |
| JP | 2013243307 A | | 12/2013 |
| JP | 2018041728 A | | 3/2018 |
| JP | 2018523922 A | | 8/2018 |
| JP | 2019-119045 | * | 7/2019 |
| JP | 2022512365 A | | 2/2022 |

OTHER PUBLICATIONS

Japanese Office Action dated Jan. 6, 2023, mailed in counterpart Japanese Application No. 2019-168743, 9 pages (with translation).
Japanese Office Action dated Mar. 3, 2023, mailed in counterpart Japanese Application No. 2019-168743, 6 pages (with translation).

* cited by examiner

ETCHING APPARATUS AND ETCHING METHOD

CROSS-REFERENCE TO RELATED APPLICATION(S)

This application is based upon and claims the benefit of priority from Japanese Patent Application No. 2019-168743, filed Sep. 17, 2019, the entire contents of which are incorporated herein by reference.

FIELD

Embodiments described herein relate generally to an etching apparatus and an etching method.

BACKGROUND

It is required to appropriately control the shape of features formed by ion etching.

DETAILED DESCRIPTION

Figure 1:
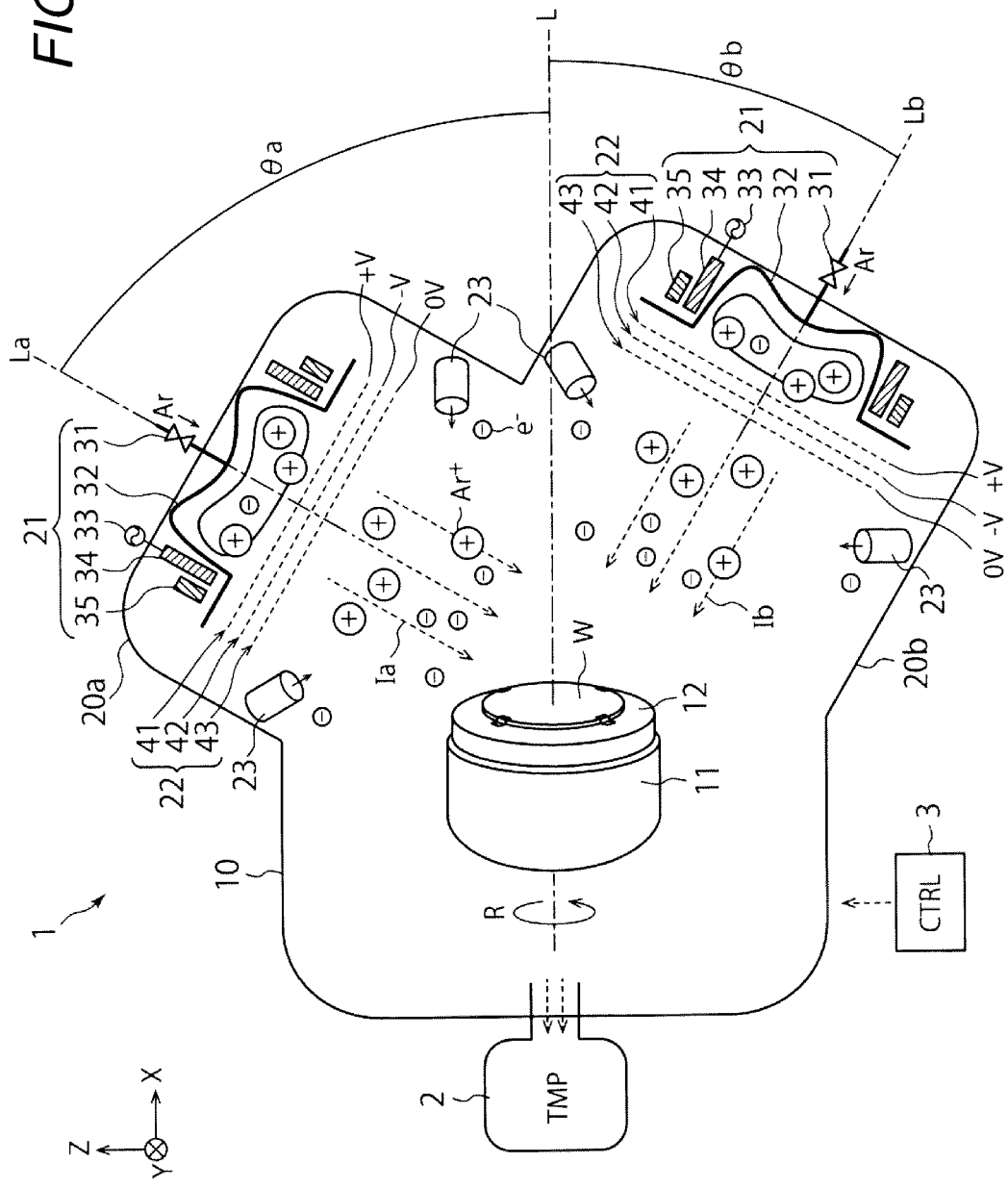
FIG. 1 depicts aspects of a configuration of an etching apparatus according to a first embodiment.

An etching apparatus and an etching method capable of appropriately controlling a shape of a features formed from a to-be-processed layer are described.

In general, according to one embodiment, an etching apparatus includes a substrate holder configured to hold a substrate; a first ion source that generates first ions and irradiates the substrate with the first ions such that the first ions are incident on the substrate in the substrate holder at a first incident angle; and a second ion source that generates second ions and irradiates the substrate with the second ions such that the second ions are incident on the substrate at a second incident angle different from the first incident angle. A controller is configured to control at least one of the first incident angle and the second incident angle by moving at least one of the first ion source and the second ion source.

Certain example embodiments of the present disclosure will be described with reference to the drawings. In the drawings, elements/aspects which are substantially the same are denoted using the same reference symbols and description of such repeated elements/aspects may be omitted in some instances.

First Embodiment

FIG. 1 schematically depicts a configuration of an etching apparatus in a first embodiment.

The etching apparatus depicted in FIG. 1 is a semiconductor manufacturing apparatus used for performing ion etching. The etching apparatus comprises an etching chamber 1, a turbo molecular pump (TMP) 2, and a control section 3 (also referred to as a controller). The etching chamber 1 has a chamber body 10, a first ion source 20a, and a second ion source 20b.

FIG. 1 depicts an X direction and a Y direction which are parallel to a surface on which the etching apparatus is installed, and a Z direction perpendicular to a surface on which the etching apparatus is installed. In the present specification, a +Z direction is considered by convention as an upward direction and −Z direction is considered by convention as a downward direction. It is noted, however, that the −Z direction need not necessarily match the direction of gravity. FIG. 1 schematically shows an approximate XZ cross-section of the etching apparatus.

A stage 11, an Electrostatic Discharge (ESD) section 12 are inside the chamber body 10. The stage 11 holds a wafer W (also referred to as a substrate or a workpiece) that is transported into the chamber body 10 from a side portal or entrance thereof. FIG. 1 shows a rotational axis L for the stage 11. The stage 11 holds the wafer W in such a manner that a center of the wafer W is located on the rotational axis L and a primary surface of the wafer W is perpendicular to the rotational axis L. The stage 11 can rotate the wafer W about the rotational axis L as indicated by an arrow R. The stage 11 is an example of a holding section and may be referred to in some contexts as a substrate holder, a holder, a wafer chuck, a chuck, a workpiece stage, or the like). The ESD section 12 is provided on a surface of the stage 11 and serves to remove static electricity from the wafer W when held by the stage 11. The stage 11 holds the wafer W via the ESD section 12.

The wafer W includes, for example, a semiconductor substrate, semiconductor wafer, or other workpiece such as a silicon substrate or the like. One or more layers may be provided on the semiconductor substrate (wafer W). The etching apparatus in the present embodiment may perform ion etching on any layer on the substrate or may perform ion etching on the semiconductor substrate itself in some examples.

The first ion source 20a generates ions from a predetermined source gas and bombards the wafer W with the ions such that these ions are incident on the wafer W at a first incident angle θa. This source gas is, for example, an argon (Ar) gas and ions in this case are argon ions (Ar$^+$). The first incident angle θa in the present embodiment is the angle formed between the rotational axis L of the stage 11 and an axis La of the first ion source 20a. Reference symbol "Ia" in FIG. 1 denotes the argon ions and the electrons generated from the argon gas which are headed to the wafer W along the axis La from the ion source 20a.

The second ion source 20b generates ions from a predetermined source gas and bombards the wafer W with the ions such that these ions are incident on the wafer W at a second incident angle θb. This source gas is, for example, an argon gas (Ar) and ions in this case are argon ions (Ar$^+$). The second incident angle θb in the present embodiment is the angle formed between the rotational axis L of the stage 11 and an axis Lb of the second ion source 20b. Reference symbol "Ib" in FIG. 1 denotes the argon ions and electrons generated from the argon gas which are headed to the wafer W along the axis Lb.

While the first ion source 20a and the second ion source 20b bombard the wafer W with argon ions in the present embodiment, the first ion source 20a and the second ion source 20b may supply the wafer W with other ions. Examples of such other ions include ions of rare gases such as helium (He), neon (Ne), krypton (Kr), and xenon (Xe), oxygen (O) ions, and nitrogen (N) ions. Furthermore, while the first ion source 20*a* and the second ion source 20*b* bombard the wafer W with ions of the same type (argon ions) in the present embodiment, the first ion source 20*a* and the second ion source 20*b* may instead supply ions of different types from each other.

The first ion source 20*a* and the second ion source 20*b* are each comprise an ion generation section 21, which includes a gas supply section 31, a bell jar 32, a high-frequency power supply 33, an antenna 34, and an electromagnet (EM) 35, an ion irradiation section 22, which includes a first grid electrode 41, a second grid electrode 42, and a third grid electrode 43, and a plurality of neutralizers 23. While operations of these various elements of the first ion source 20*a* and the second ion source 20*b* are described below by reference to operations of the first ion source 20*a*, the following description similarly applies to the second ion source 20*b*.

The ion generation section 21 generates ions (argon ions) within the bell jar 32 from the gas (argon gas) supplied from the gas supply section 31. The bell jar 32 is a container formed from quartz. The high-frequency power supply 33 supplies high-frequency power to the antenna 34 provided on a side of the bell jar 32. The EM 35 is provided on the side of the bell jar 32 similarly to the antenna 34. The ion generation section 21 supplies a microwave RF power and a magnetic field to the source gas using the high-frequency power supply 33, the antenna 34, and the EM 35 to change the source gas to ions.

The ion irradiation section 22 supplies the wafer W with ions generated by the ion generation section 21 such that the ions are incident on the wafer W at the first incident angle θa. The ion irradiation section 22 is configured with the first grid electrode 41 to which a voltage "+V" is applied and which functions as an accelerating electrode, the second grid electrode 42 to which a voltage "−V" is applied and which functions as an extraction electrode, and the third grid electrode 43 to which a voltage of 0V is applied and which functions as a ground electrode. The ion irradiation section 22 bombards the wafer W with ions using these electrodes 41 to 43. These electrodes 41 to 43 are of a mesh shape such that ions can be accelerated therethrough.

The neutralizers 23 are provided to supply electrons to the surface of the wafer W and to prevent charge-up (charge buildup) on the surface of the wafer W. The neutralizers 23 may be provided at positions different from those shown in FIG. 1.

The TMP 2 is provided to evacuate the etching chamber 1 of ambient atmosphere. The etching apparatus in the present embodiment may be configured with another pump type for evacuating the etching chamber 1.

The control section 3 controls various operations of the etching apparatus in the present embodiment. Possible examples of a control section 3 include a processor, an electric controller circuit, and/or a computer. The control section 3 controls operations of the first ion source 20*a*, operations of the second ion source 20*b*, evacuation of the etching chamber 1 with the TMP 2, and the like.

The control section 3 in the present embodiment can provide control to alter the first incident angle θa and the second incident angle θb. The first ion source 20*a* and the second ion source 20*b* in the present embodiment are installed on a rail or the like, and the control section 3 can control the first incident angle θa by moving the first ion source 20*a* along the rail, and control the second incident angle θb by moving the second ion source 20*b* along the rail. The control section 3 may thus adjust the first incident angle θa and the second incident angle θb by the same angle amount or by different angle amounts.

The control section 3 in the present embodiment can control the first incident angle θa and the second incident angle θb independently of each other. For example, the control section 3 can increase or reduce either the first incident angle θa or the second incident angle θb while keeping the other angle θa or θb at a fixed value. Alternatively, the control section 3 can reduce either of the first incident angle θa or the second incident angle θb while increasing the other angle θa or θb.

Controlling the first incident angle θa and the second incident angle θb permits the control section 3 of the present embodiment to perform ion etching in a manner which enables the ions from the first ion source 20*a* and the ions from the second ion source 20*b* to provide ion etching for the appropriate/desired features to be formed on the substrate W. For example, when the wafer W is a semiconductor substrate and an interconnection layer provided on the semiconductor substrate (W), it is possible to form an interconnection pattern of a desired shape for the interconnection layer.

In general, for forming a Line and Space (L/S) pattern Reactive Ion Etching (RIE) is utilized. However, it can be difficult to process the such a pattern by RIE using the existing art when the layer being patterned is a metal layer. For example, a magnetic layer containing nickel (Ni), cobalt (Co), and iron (Fe) is particularly difficult to process using RIE methods. Typically, when a layer is processed by RIE, any increase in an etching rate must be traded off against a reduction in re-deposition of materials from the etched layer. For that reason, when the etching rate is to be increased, then more re-deposition occurs so as to make the resulting final etched shape of the pattern features inappropriate. For example, there is also a concern that dust/particulates generated by RIE will adhere to etched pattern features or the that the etched features will have an undesirable tapered shape.

To address the problem, the etching apparatus in the present embodiment has the two ion sources (the first ion source 20*a* and the second ion source 20*b*) and performs ion etching while controlling the first incident angle θa and the second incident angle θb. This makes it possible to reduce re-deposition while still increasing the etching rate. According to experiments, the magnitude of the etching rate and the amount of the re-deposition depend on the incident angle of ions hitting the wafer W. According to the present embodiment, by adjusting one of the first incident angle θa and the second incident angle θb to an angle suited for increasing the etching rate and then adjusting the other of the incident angles θa and θb to an angle suited for reducing the re-deposition provides both an increase in the etching rate and a reduction in the re-deposition.

It is noted that each of the first ion source 20*a* and the second ion source 20*b* in the present embodiment is configured with grid electrodes (first grid electrode 41, second grid electrode 42, and third grid electrode 43) as the ion irradiation section 22. Using these grid electrodes 41 to 43 makes it possible to bombard a wide region of the wafer W, which is, for example, the entire upper surface of the wafer W, with ions. Since the entire surface of the wafer W is bombarded with ions, it is possible to reduce the number of times a scanning of the wafer W with a smaller ion beam would be required and/or to dispense entirely with the operation of scanning the wafer W with the smaller ion beam. In general, when the wafer W is scanned with an ion beam, particles generated by the ion etching in one portion of the wafer tend to adhere to another portion of the wafer W. According to the present embodiment, therefore, configuring the ion irradiation section 22 with the first to third grid electrodes 41 to 43 makes it possible to reduce adhesion of the particles that would otherwise accompany ion beam scanning methods and to facilitate film processing into a desired shape/pattern.

In the present embodiment, in the case of forming a L/S interconnection pattern, the first incident angle θa is set to, for example, 80 degrees and the second incident angle θb is set to, for example, an angle less than 80 degrees. In this case, it is possible to process the interconnection layer at a high speed with the first ion source 20a but to prevent the interconnections from being processed into a tapered shape by using the second ion source 20b. It is noted that the second incident angle θb is set to the angle selected to prevent the taper shape from appearing. The etching apparatus in the present embodiment may process a wafer W with the first and second ion sources 20a and 20b while rotating the wafer W using the stage 11.

The L/S interconnection pattern may be formed from a layer deposited on the surface of the semiconductor substrate. A mask layer (for example, resist mask layer or hard mask layer) can be formed on a surface of the deposited layer then patterned into an L/S mask pattern. The L/S mask pattern can then be transferred into the deposited layer. The deposited layer may be referred to as an interconnection layer or a first film in some contexts. A line patterns of the L/S mask pattern are an example of a plurality of masking portions. These line patterns extend in the same direction (first pattern direction) on the surface of the deposited interconnection layer. The deposited interconnection layer may be etched while the control section 3 controls the ion flux of the first ions and the second ions to be incident on the wafer W primarily when the ions will be incident from a direction paralleling the first pattern direction. For example, the control section 3 may control first ion irradiation timing, second ion irradiation timing, and a revolving speed of the stage 11 in such a manner that the first ions or the second ions are incident on the wafer W only when the first ions or the second ions are incident from a direction parallel to the first pattern direction. It is thereby possible to increase the etching rate and a mask selection ratio at the time of forming the L/S interconnection pattern.

The control section 3 in the present embodiment can set values for the first incident angle θa and the second incident angle θb by, for example, the following method. A user of the etching apparatus may input values of the first incident angle θa and the second incident angle θb, and the control section 3 may adjust the values of the first incident angle θa and the second incident angle θb to match to these values. Alternatively, the control section 3 may automatically set the values of the first incident angle θa and the second incident angle θb without user input.

Figure 2:
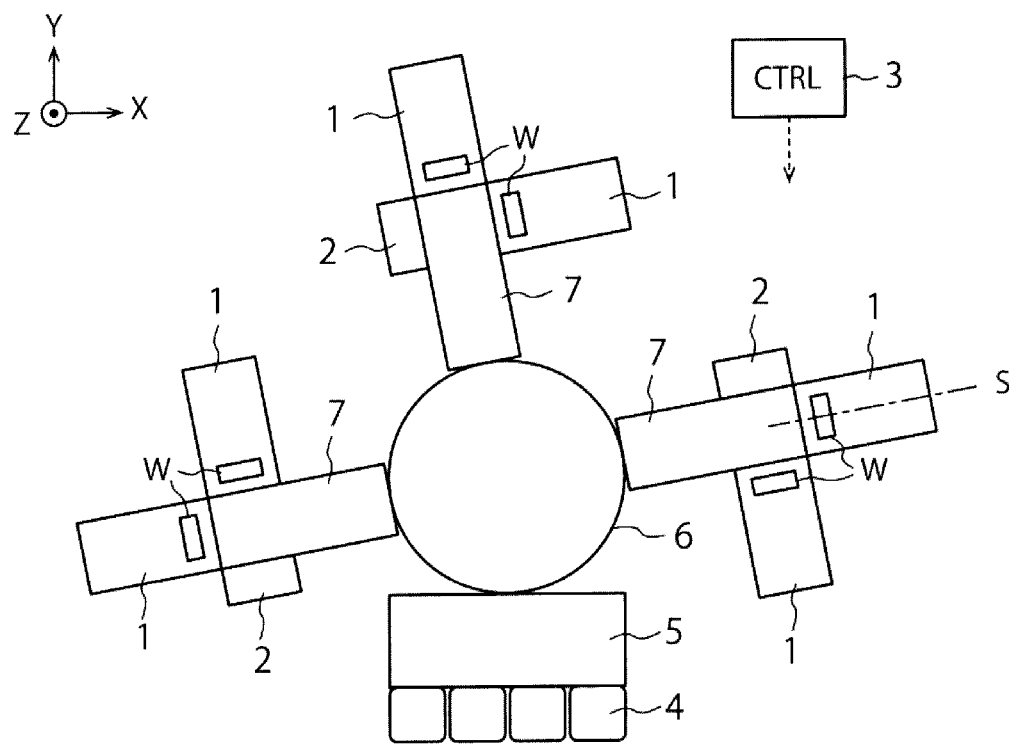
FIG. 2 is a plan view showing a configuration of an etching apparatus according to a first embodiment.

FIG. 2 is a plan view showing the configuration of the etching apparatus in the first embodiment.

As shown in FIG. 2, the etching apparatus in the present embodiment is configured with six etching chambers 1, three TMPs 2, one control section 3, four Front Opening Unified Pod (FOUP) tables 4, a load module 5, a transfer chamber 6, and three load lock chambers 7.

Each etching chamber 1, each TMP 2, and the control section 3 shown in FIG. 2 has the same structures and functions as those of the etching chamber 1, the TMP 2, and the control section 3 already described with reference to FIG. 1. FIG. 1 can be considered a cross-sectional view of one of the etching chambers 1 at the surface S shown in FIG. 2. While the X direction shown in FIG. 2 is slightly inclined with respect to the surface S, FIG. 1 depicts the etching chamber 1 using the simplifying assumption that the X direction is parallel to the surface S to facilitate visualization.

In the present embodiment, when a FOUP (in which a wafer W to be processed is accommodated) is placed on any of the FOUP tables 4, the wafer W in the FOUP can be carried to any of the etching chambers 1 via the load module 5, the transfer chamber 6, and a corresponding load lock chamber 7, and then processed by etching within this etching chamber 1. After completion of the processing, the wafer W is carried out from this etching chamber 1, and returned to the FOUP via the load lock chamber 7, the transfer chamber 6, and the load module 5. It is noted in some examples that the wafer W can be transported within the etching apparatus by a carrying arm (robot arm) or the like disposed in the transfer chamber 6.

Figure 3:
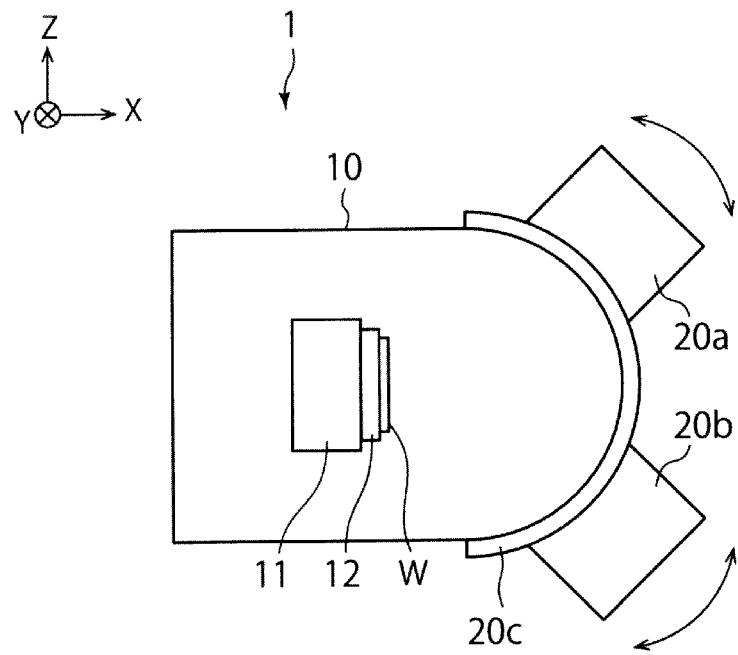
FIG. 3 is a cross-sectional view for explaining certain operational aspects of an etching apparatus according to a first embodiment.
Figure 4A:
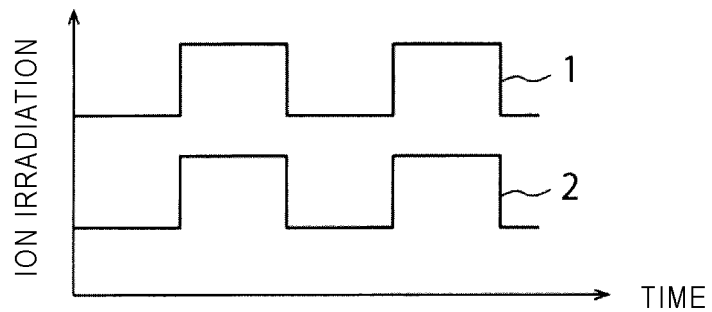
FIGS. 4A to 4D are graphs for explaining certain operational aspects of an etching apparatus according to a first embodiment.
Figure 4B:
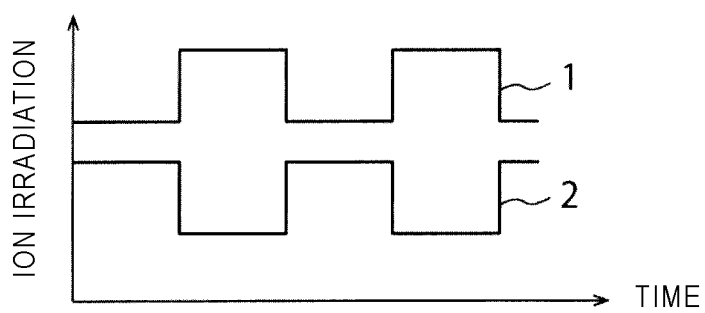
Figure 4C:
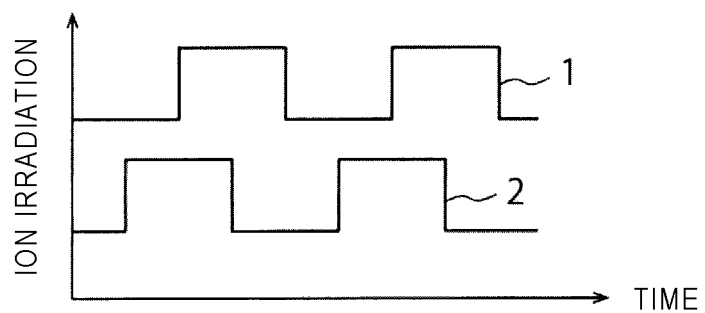
Figure 4D:
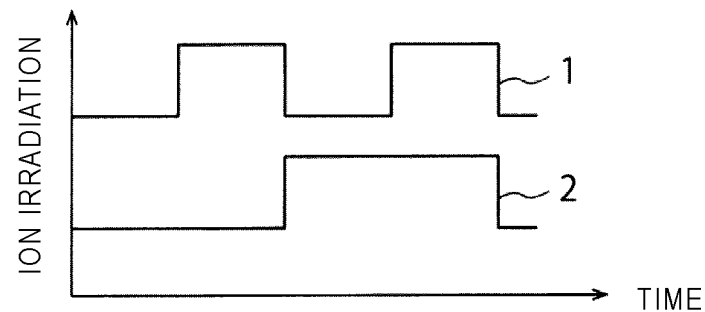

FIG. 3 is a cross-sectional view for explaining operations of the etching apparatus in the first embodiment.

Similarly to FIG. 1, FIG. 3 shows an XY cross-section of the etching chamber 1, but shows the etching chamber 1 more schematically (less detail) than in FIG. 1 to make description easier to understand. As shown in FIG. 3, the etching chamber 1 of the present embodiment is configured with a rail 20c that has a circular arc shape and that is attached to the chamber body 10.

As shown in FIG. 3, the first ion source 20a and the second ion source 20b are movable along the rail 20c. The control section 3 can change the first incident angle θa by moving the first ion source 20a along the rail 20c and can change the second incident angle θb by moving the second ion source 20b along the rail 20c.

The first ion source 20a in the present embodiment may be configured, for example, such that the first incident angle θa can be changed from a value around zero degrees to a value around 90 degrees. Likewise, the second ion source 20b in the present embodiment may be configured, for example, such that the second incident angle θb can be changed from the value around zero degrees to the value around 90 degrees. It is conceivable that the shape of the rail 20c is set to a circular arc shape spanning approximately 180 degrees.

While the first ion source 20a and the second ion source 20b are depicted as disposed on the same rail 20c in FIG. 3, the first ion source 20a and the second ion source 20b may instead be disposed on different rails. Alternatively, the first ion source 20a may be moved along two different rails disposed in parallel to each other, and the second ion source 20b may be similarly moved on two different rails disposed in parallel to each other.

FIGS. 4A to 4D are graphs for showing aspects of the operations of the etching apparatus in the first embodiment.

FIGS. 4A to 4D respectively show first to fourth examples of the timing of irradiating the wafer W with ions from the first ion source 20a and the second ion source 20b. In FIGS. 4A to 4D, a period in which a value on the vertical axis ("ion radiation") is high indicates a period in which the wafer W is being irradiated with ions, and a period in which the value of the vertical axis is low indicates a period in which the wafer W is not being irradiated with ions.

In the first example (FIG. 4A), the wafer W is irradiated simultaneously with ions from the first ion source 20a and ions from the second ion source 20b. In the second example (FIG. 4B), the wafer W is irradiated alternately with ions from the first ion source 20a and then ions from the second ion source 20b. The control section 3 in the present embodiment may irradiate the wafer W with ions as in the first example or the second example.

In the third example (FIG. 4C), periods in which the wafer W is irradiated with ions from the first ion source 20a partially overlap the periods in which the wafer W is irradiated with ions from the second ion source 20b. Therefore, in the third example, the wafer W is irradiated simultaneously with the first ions and the second ions in some periods, while the wafer W is irradiated with only one or the other of the first ions or the second ions in some other periods.

In the first to third examples, a length of a cycle in which the wafer W is irradiated with the first ions is equal to a length of a cycle in which the wafer W is irradiated with the second ions. In the fourth example (FIG. 4D), the length of the cycle in which the wafer W is irradiated with the first ions differs from the length of the cycle in which the wafer W is irradiated with the second ions. Thus, the length of the cycle in which the wafer W is irradiated with the first ions may be the same as or different from the length of the cycle in which the wafer W is irradiated with the second ions.

It is noted that a frequency of a waveform in each of the first to third examples is, for example, several tens of Hz to several hundreds of Hz. In this case, the wafer W is irradiated with first ion pulses several tens to several hundreds of times per second, while the wafer W is also irradiated with second ion pulses several tens to several hundreds of times per second. On the other hand, the revolving speed of the stage 11 is set to, for example, several tens of rpm.

As described above, the etching apparatus in the present embodiment is provided with the first ion source 20a and the second ion source 20b for each etching chamber 1, and controls the first incident angle θa and the second incident angle θb to preform ion etching of the wafer W. Therefore, according to the present embodiment, it is possible to exercise appropriate control over the shape of the to-be-processed layer, such as control such that the re-deposition rate is reduced while the etching rate is increased.

It is noted that the etching apparatus in the present embodiment may also be configured with three or more ion sources for which incident angles of ions can be controllable for each etching chamber 1. Each ion source in this case can be configured similarly to either the first ion source 20a or the second ion source 20b. In such a case, it is preferable that the incident angles of each of these ion sources be controllable independently of one another.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. An etching method, comprising:
    placing a substrate in a substrate holder, the substrate having a first film and a line-space pattern on the first film, the line-space pattern including lines extending in a first direction;
    irradiating the substrate with first ions incident on the substrate at a first incident angle, the first ions being generated by a first ion source;
    irradiating the substrate with second ions incident on the substrate at a second incident angle that is different from the first incident angle, the second ions being generated by a second ion source; and
    etching the first film while rotating the substrate and controlling irradiation per unit time from the first ion source and the second ion source to be a first intensity when the substrate is oriented such that first ions are incident on the line-space pattern from a direction parallel to the first direction and reducing irradiation per unit time of the first ions and the second ions to a second intensity when the first ions are incident on the line-space pattern from a second direction different from the first direction.

2. The etching method according to claim 1, wherein the first and second ions are each argon ions.

3. The etching method according to claim 1, further comprising:
    adjusting the second incident angle to reduce re-deposition of material on the line-space pattern.

* * * * *